United States Patent [19]

Nagura

[11] Patent Number: 5,851,856
[45] Date of Patent: Dec. 22, 1998

[54] MANUFACTURE OF APPLICATION-SPECIFIC IC

[75] Inventor: Masahiko Nagura, Hamamatsu, Japan

[73] Assignee: Yamaha Corporation, Hamamatsu, Japan

[21] Appl. No.: 346,672

[22] Filed: Nov. 30, 1994

[30] Foreign Application Priority Data

Dec. 3, 1993 [JP] Japan .................................. 5-304441

[51] Int. Cl.[6] ............................ H01L 21/28; H01L 21/44
[52] U.S. Cl. ...................... 438/130; 438/132; 438/601; 438/702; 438/940; 438/717; 438/736; 438/671
[58] Field of Search ................................. 437/228, 923; 156/661.11, 659.1; 438/717, 736, 671, 130, 132, 601, 702, 940

[56] References Cited

U.S. PATENT DOCUMENTS

| | | | |
|---|---|---|---|
| 4,518,629 | 5/1985 | Jeuch ........................................ | 438/702 |
| 4,632,725 | 12/1986 | Hartmann et al. .................. | 156/659.11 |
| 4,666,553 | 5/1987 | Blumenfeld et al. .............. | 156/659.11 |
| 4,675,984 | 6/1987 | Hsu ........................................ | 438/702 |
| 4,689,112 | 8/1987 | Bersin ...................................... | 156/643 |
| 4,708,720 | 11/1987 | Pasch .................................. | 156/659.11 |
| 4,720,620 | 1/1988 | Arima ...................................... | 438/940 |
| 4,740,485 | 4/1988 | Sharpe-Geisler ........................ | 438/132 |
| 4,795,720 | 1/1989 | Kawanabe .............................. | 438/940 |
| 4,829,025 | 5/1989 | Iranmanesh ............................ | 437/238 |
| 5,021,121 | 6/1991 | Groechel et al. ...................... | 437/238 |
| 5,096,850 | 3/1992 | Lippitt, III .............................. | 438/601 |
| 5,139,963 | 8/1992 | Suzuki et al. .......................... | 437/923 |
| 5,173,442 | 12/1992 | Carey ...................................... | 438/940 |
| 5,466,636 | 11/1995 | Cronin et al. ............................ | 437/187 |

FOREIGN PATENT DOCUMENTS

| | | | |
|---|---|---|---|
| 54-14165 | 2/1979 | Japan ................................ | 156/659.11 |
| 55-46582 | 4/1980 | Japan ................................ | 156/659.11 |
| 58-40852 | 3/1983 | Japan ................................ | 156/659.11 |
| 60-37165 | 2/1985 | Japan ...................................... | 437/923 |
| 60-60766 | 4/1985 | Japan ................................ | 156/659.11 |
| 1-235252 | 9/1989 | Japan ...................................... | 437/423 |

OTHER PUBLICATIONS

Wolf, Stanley *Silicon Processing for the VLSI Era* vol. 1, pp 541, 428.

Wolf Stanley *Silicon Processing for the VLSI Era*, vol. 2, pp 316–318.

Wolf, Stanley, *Silicon Processing for the VLSI Era*, vol. 2, pp. 180–183, 194–194, 1990.

"Silicon Processing for the VLSI Era", *Process Technology*, Stanley Wolf, et al, vol. 1, pp. 423–424 (1986).

"Semiconductor Dry Etching Technique", Takashi Tokuyama, et al, pp. 206–218 (1992 Oct.).

"Organometallic Materials in Lithography: A Review", *J. Vac. Science Technology*, M. Hatzakis, et al, Vo. B.6(6) (1988).

"High Resolution, Steep Profile Resist Patterns", *J. Vac. Science Technology*, J. M. Moran, et al, Vo. 16(6) (1979).

*Primary Examiner*—Chandra Chaudhari
*Assistant Examiner*—Matthew Whipple
*Attorney, Agent, or Firm*—Loeb & Loeb LLP

[57] ABSTRACT

After an insulating film is deposited over metal patterns, a resist film is coated over the whole surface of the insulating film until the surface of the resist film becomes flat. The resist film is removed by reactive ion etching until a partial surface area of the insulating film deposited over the metal patterns is exposed. Another photoresist film is coated on the surface to cover a part of the exposed areas of the insulating film and the resist film, exposed and developed to form a resist mask. The area not covered with the resist mask and the resist film is selectively removed by anisotropic etching. The resist mask and the resist film are removed to obtain a window having a width equal to the width of a convex of the insulating film. A method of manufacturing a semiconductor device that is capable of exposing a metal wiring layer at a high precision is provided.

28 Claims, 9 Drawing Sheets

MANUFACTURE OF APPLICATION-SPECIFIC IC

BACKGROUND OF THE INVENTION a) Field of the Invention

The present invention relates to a method suitable for manufacturing semiconductor devices such as gate-arrays and application specific integrated circuits (ASICS).

b) Description of the Related Art

As one kind of semiconductor integrated circuit, there are known gate array devices from which a plurality of types of LSIs are manufactured. Such LSIs are manufactured by preparing a number of cells of basic element groups or basic logical circuit on semiconductor chips and thereafter, and in accordance with circuit designs, changing only wiring patterns. For such gate array devices, there is a method of forming wiring patterns expected to be used most often and after circuit design, cutting unnecessary wiring patterns by a laser beam or the like. More specifically, wiring patterns are first formed on a chip, and a protective film is deposited over the chip with the wiring patterns. After circuit design, the protective film on the wiring pattern to be cut is removed to form a window, and the wiring pattern exposed in the window is cut. With this method, it becomes possible to form customized LSIs in a short time. An example of ICs manufactured by such a method is Laser Programmable Gate Arrays (LPGA) by Quick Technology Inc.

FIG. 3A is a partial plan view of a semiconductor chip for such an IC under manufacture. As shown in FIG. 3A, windows W1 to W3 are formed in the substrate surface. A second metal wiring layer M2 is exposed at each of the windows W1 to W3.

FIG. 3B is a cross sectional view taken along line IIIB—IIIB of FIG. 3A. As shown in FIG. 3B, the second metal wiring layer M2 is formed on a second interlayer insulating film 52 deposited on a first metal wiring layer M1. An insulating film 53 as a protective film is deposited on the second metal wiring layer M2. The insulating film 53 is selectively etched to form the window W2 and to expose the second metal wiring layer M2. The insulating films 52 and 53 are made of, for example, a nitride film such as SiN or an oxide film such as SiO.

A method of forming the window W2 will be described.

As shown in FIG. 4A, after the second metal wiring layer M2 is formed on the second interlayer insulating film 52, the insulating film 53 such as SiN is deposited by CVD on the surface of the second interlayer insulating film 52 and second metal wiring layer M2. In order to selectively expose the second metal wiring layer M2, a photoresist film 54 is formed on the insulating film 53, exposed and developed to form a resist pattern. The insulating film 53 not covered by the photoresist pattern is etched. This etching process is performed by using an etching selectivity between the second interlayer insulating film 52 and the insulating film 53. After the etching process, the window W2 such as shown in FIG. 3B is formed.

This method necessitates different film qualities of the second interlayer insulating film 52 under the second metal wiring layer M2 and the insulating film 53 covering the second metal wiring layer M2. If the qualities of the second interlayer film 52 and the insulating film 53 are the same or similar or if the films have similar etching properties relative to the etchant even if the film qualities are different, then a sufficient etching selectivity cannot be obtained. If both films are formed by oxide films, the second interlayer insulating film 52 under the insulating film 53 may also be etched as shown in FIG. 4B and the first metal wiring layer M1 under the second interlayer insulating film 52 may be exposed.

From the viewpoint of semiconductor device performance and manufacturing processes, there are many cases wherein materials other than silicon oxide are not desired to be used as the interlayer insulating film and the protective insulating film.

As a means for preventing a possible failure of excessively etching the second interlayer insulating film under the insulating film, respectively of silicon oxide, a method of controlling the width of a window to be formed in a resist film has been used. As shown in FIG. 4C, an opening 55 of the photoresist film 54 is set to have a width narrower than the width $W_T$ of a convex of the insulating film 53 and narrower than the width $W_M$ of the second metal wiring layer M2, so that the second metal wiring layer M2 locates within the area of the opening 55. By using the resist pattern 54 as an etching mask, the insulating film 53 is etched. Thereafter, the resist pattern 54 is removed. A window 55a having a width of $W_w$ is formed as shown in FIG. 4D.

This method has been found, however, not satisfactory in the following cases. As shown in FIG. 4E, if the position of the opening 55 of the photoresist pattern 54 is displaced from the correct position, the insulating film 53 is left on the second metal wiring layer M2 at one area and the etching is performed excessively at the other area, as shown in FIG. 4F.

As shown in FIG. 4G, if the width of the opening 55 of the photoresist pattern 54 is too large, the etching is performed excessively at opposite areas of the second metal wiring layer MZ as shown in FIG. 4H, leaving a danger of exposing the underlying metal wiring layer.

As shown in FIG. 4I, if the width of the opening 55 is too small, the insulating film 53 is left in contact with the side walls of the second metal wiring layer M2 as shown in FIG. 4J. The insulating film 53 may also remain on the upper surface of the second metal wiring layer M2.

Such cases as shown in FIGS. 4F, 4H, and 4J make it difficult to precisely cut the second metal wiring layer M2.

SUMMARY OF THE INVENTION

It is an object of the present invention to provide a method of manufacturing a semiconductor device that is capable of precisely forming a window in an insulating film, the window exposing an overlying metal wiring layer.

It is another object of the present invention to provide a method of manufacturing a hard-wired gate array device with wiring layers of a multi-layer wiring structure, capable that is of forming a window in an interlayer insulating film having physical features (convexes) conformal with wiring patterns, the window being formed in self-alignment with the physical features.

According to one aspect of the present invention, there is provided a method of manufacturing a semiconductor device including the steps of: forming an insulating film over a wiring layer pattern formed on a substrate; forming a planarized film over the whole surface of the insulating film until the surface of the planarized film becomes flat, the planarized film being made of a material having a different property from the insulating film; removing the planarized film until the partial surface area of the insulating film formed on the top of the metal wiring pattern is exposed; forming a resist film on the surface of the exposed insulating film and the planarized film; patterning the resist film to form a resist pattern having an opening exposing at least one partial exposed surface area of the insulating film; and selectively removing a partial area of the insulating film not covered with the planarized film and the resist pattern and exposing a partial area of the metal wiring pattern.

It is preferable to remove the resist pattern and the planarized film after the preceding steps.

The planarized film can be used as an etching mask because it covers the whole area other than the exposed partial surface area of the insulating film deposited over the wiring patterns. If the etching resistance of the planarized film is sufficient, it is less necessary to consider the etching selectivity between the insulating film and the material under the insulating film. In removing the insulating layer in order to form a window for exposing a desired area of the metal wiring pattern, the width of the window is determined in a self-alignment manner by the width of the metal wiring pattern and the width of the insulating layer formed on the side walls of the metal wiring pattern. It is possible to expose the tops and side walls of the metal wiring layer. Therefore, even if there is some displacement of a resist pattern or some size error, the precision of a window for exposing a metal wiring pattern is not affected so much. A variation in widths of windows becomes small. Furthermore, since the width of an opening of a resist pattern can be made sufficiently large, it is not necessary to form a resist pattern at a high precision while taking a size error into consideration. The manufacturing processes are provided with an area margin of a wiring region, improving a manufacturing yield.

BRIEF DESCRIPTION OF THE DRAWINGS

FIG. 3A is a plan view showing the relationship between the metal wiring layer and windows, and FIG. 3B is a schematic cross sectional view showing two metal wiring layers M1 and M2.

DETAILED DESCRIPTION OF PREFERRED EMBODIMENTS

There is a strong tendency towards the degree of integration of semiconductor integrated circuit devices becoming higher and higher. For high integration semiconductor devices, wiring patterns tend to become complicated and the number of wiring layers of a multi-layer wiring structure tends to increase. For the isolation between a plurality of wiring layers, it is necessary to dispose an interlayer insulating film between adjacent wiring layers.

An interlayer insulating film covering a wiring pattern formed on the surface of a flat underlying layer has in many cases convexes and concaves conformal with topography of the wiring pattern. If a flat surface of the interlayer insulating film is desired, a planarization process is performed or a planarized film is formed.

An LSI having desired circuits can be formed by selectively using basic logic circuits (cells) formed on a semiconductor chip of a gate array device. A widely used method is to form underlying wiring layers on a chip and after circuit design, an overlying wiring layer is formed. In order to shorten the time required for manufacturing a final semiconductor device after circuit design, it is desired to form as many overlying wiring patterns as possible before circuit design. To this end, a method has been proposed by which overlying wiring patterns expected to be used frequently are formed by a quantity over what is needed and after circuit design, unnecessary overlying wiring patterns are cut. As a method of cutting a wiring pattern, an interlayer insulating film on a wiring pattern is selectively removed to form a window exposing the wiring pattern, and a laser beam is radiated into the window to melt and evaporate the wiring pattern.

In forming a window for wiring pattern cutting, convexes and concaves of an interlayer insulating film covering the wiring layer can be positively used.

Figure 1A:
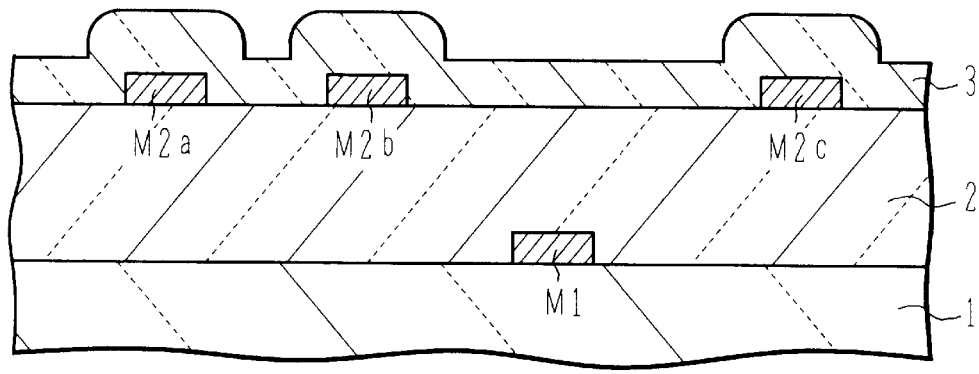
FIGS. 1A to 1H are cross sectional views explaining the main processes of a method of manufacturing a semiconductor device according to an embodiment of the invention.

An embodiment of the invention will be described with reference to the accompanying drawings. FIGS. 1A to 1H are cross sectional views explaining a method of manufacturing a semiconductor device according to an embodiment of the invention. As shown in FIG. 1A, an underlying metal wiring layer M1 of poly Si, a laminated structure of barrier metal and Al or Al alloy, a laminated structure of poly Si and refractory metal (polycide), Al, Al alloy, or other metals is formed on an insulating surface of an Si substrate 1. The insulating surface of the Si substrate 1 is formed by a silicon oxide film formed by chemical vapor deposition (CVD) or a silicate glass film doped with P or B (e.g. PSG, BPSG). MOS transistors and other elements are formed in the Si substrate under the insulating surface. The underlying metal wiring layer M1 is formed, for example, by sputtering. If the underlying metal wiring layer M1 is made of silicide such as WSi, or W, the layer M1 may be formed by CVD.

The surface of the metal wiring layer M1 is covered with an interlayer insulating film 2 such as a silicon oxide film or a silicon nitride film. Overlying metal wiring patterns M2a, M2b . . . made of Al, Al alloy, or other metals are formed on the insulating film 2. The interlayer insulating film 2 is formed by CVD like the insulating surface of the Si substrate 1. An oxide film having an excellent planarization property such as a spin-on-glass may be used. The surface of the interlayer insulating film is preferably made flat. The overlaying metal wiring layer M2 is formed by sputtering. Metal wiring patterns M having a high possibility of being used as the wiring patterns of the semiconductor elements in the Si substrate 1 are formed. After circuit design, unnecessary metal wiring patterns M2 are cut.

An insulating film 3 such as a silicon oxide film or a silicon nitride film is formed on the overlying metal wiring patterns M2. This insulating film 3 is formed, for example, by low pressure chemical vapor deposition (CVD), the surface of the insulating film being conformal with the underlying surface.

Figure 1B:
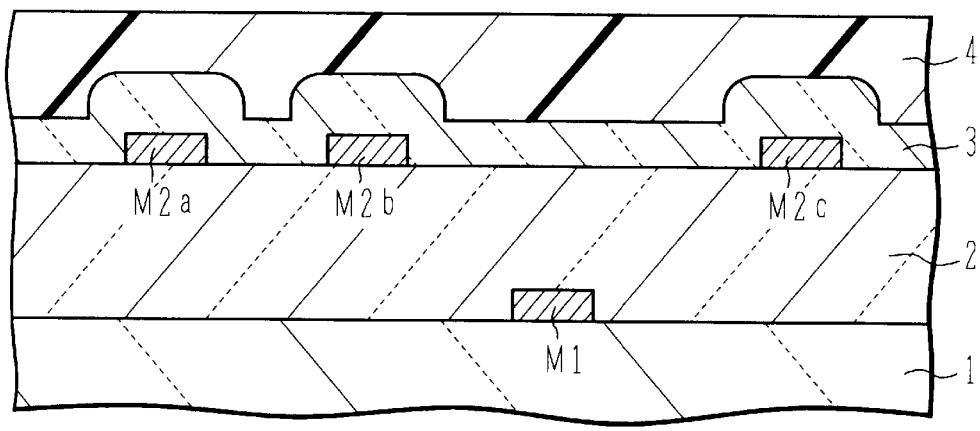

As shown in FIG. 1B, after the circuit is designed and the points of the overlying metal wiring patterns to be cut are determined, a planarized film 4 is formed on the insulating film 3 by coating or the like. The planarized film 4 is made of, for example, photoresist, polyimide, or the like, and has an etching property different from the insulating film 3. The planarized film 4 is formed until the surface thereof becomes flat, regardless of convexes and concaves of the metal wiring patterns M2. Since the planarized film 4 is removed after the overlying metal wiring layer cutting process, the material of the film 4 can be selected mainly by taking the etching selectivity into consideration.

Figure 1C:
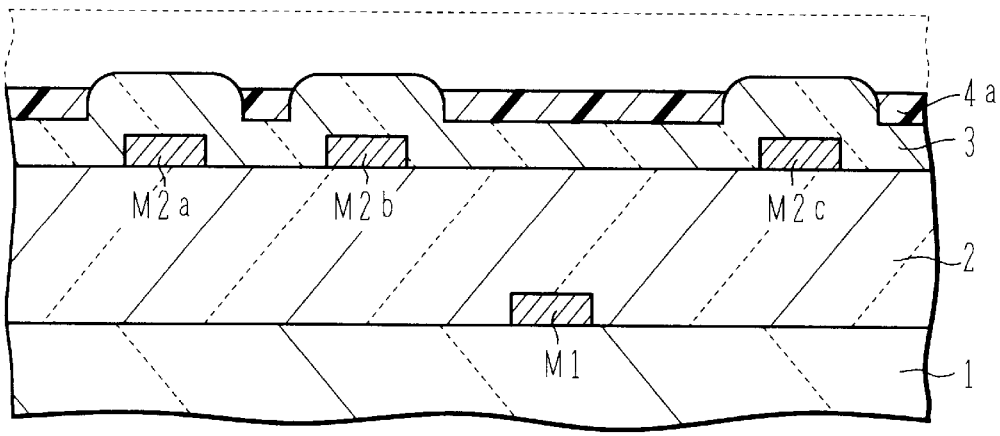

Next, as shown in FIG. 1C, the planarized film 4 is etched back until the surface of convexes of the insulating film 3 are exposed. For example, if the planarized film 4 is made of resist, it is etched in a parallel plate type dry etching system by flowing an etching gas of $O_2$ 300 sccm and $N_2$ 60 sccm mixed with 5% $H_2$, under the conditions of a pressure of 0.55 Torr, a substrate temperature of 230° C., and an RF power of 200 W at 13.56 MHz. The etching process is terminated when the convexes of the insulating film 3 are exposed while a planarized film 4a is left unetched, as shown in FIG. 1C.

Figure 1D:
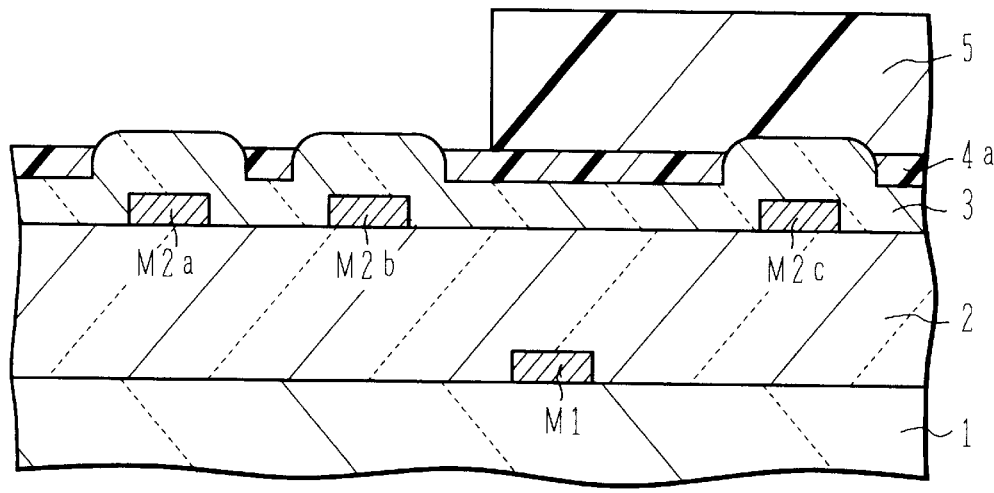

As shown in FIG. 1D, a resist film 5 is coated over a part of the insulating film 4 and the planarized film 4, exposed and developed to form a resist pattern 5 having an opening at the area corresponding to cutting points of the overlying metal wiring pattern M2. It is sufficient if only the resist pattern 5 can select desired convexes of the exposed insulating film 3. The surface of the insulating film 3 other than the convexes is covered with the planarized film 4a. The shape of an opening to be formed in the insulating film 3 is determined by the planarized film 4a. Therefore, the precision of the resist pattern 5 may be coarse.

Figure 1E:
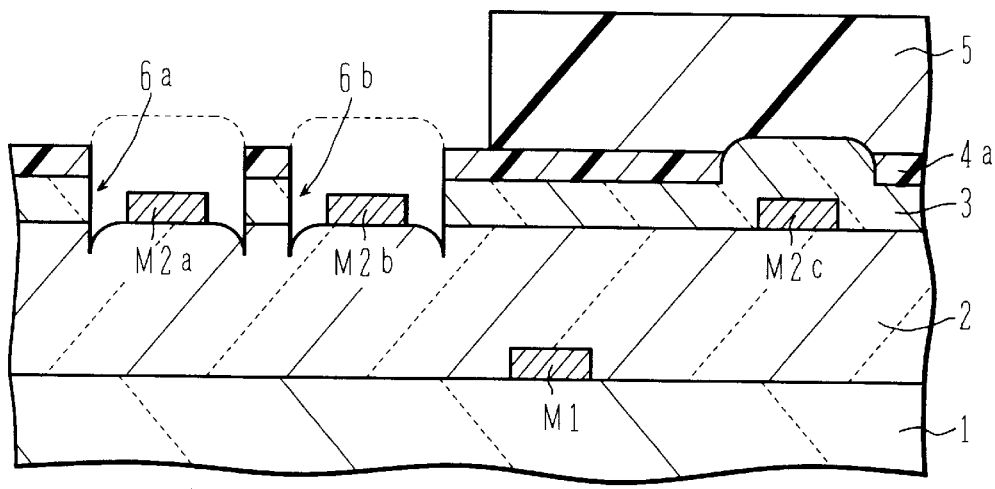

As shown in FIG. 1E, the insulating film 3 is selectively etched. For example, if the insulating film 3 is silicon oxide, it is etched in a parallel plate type dry etching system by flowing an etching gas of $CF_4$ 5 sccm, $CHF_3$ 30 sccm, and Ar 100 sccm, under the conditions of a pressure of 200 mTorr, a substrate temperature of room temperature, and an RF power of 700 W at 13.56 MHz. The insulating film 3 with the exposed surface is etched while the resist pattern 5 and the planarized film 4a operate as an etching mask.

Figure 2:
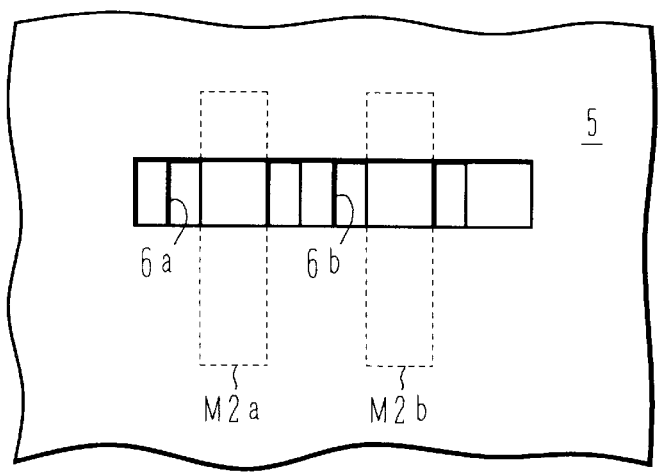
FIG. 2 is a plan view showing windows formed at the process illustrated in FIG. 1E.
Figure 3A:
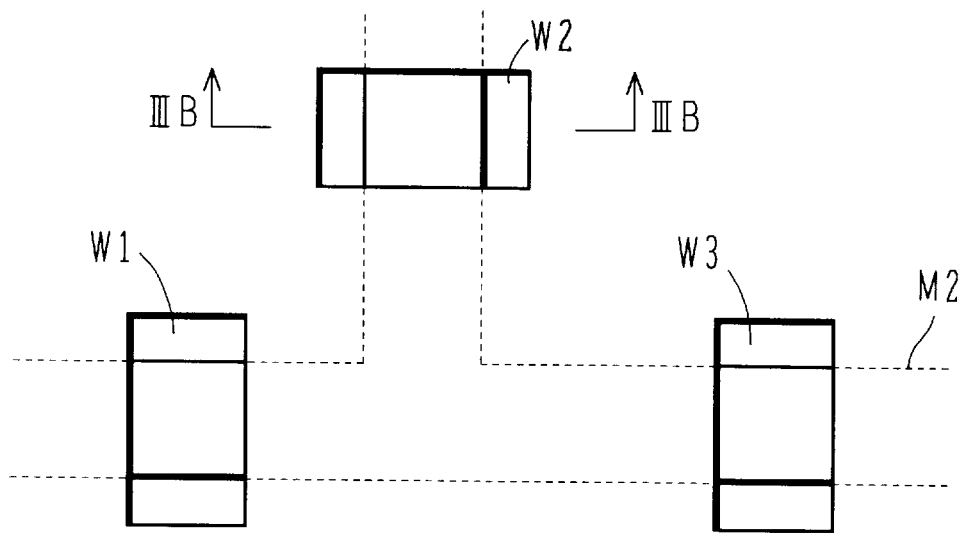
FIGS. 3A and 3B are schematic diagrams explaining a conventional technique of forming a window for exposing a metal wiring layer.
Figure 3B:
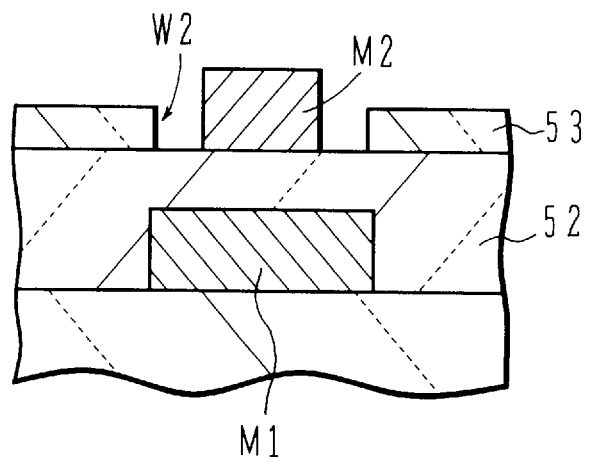
Figure 4A:
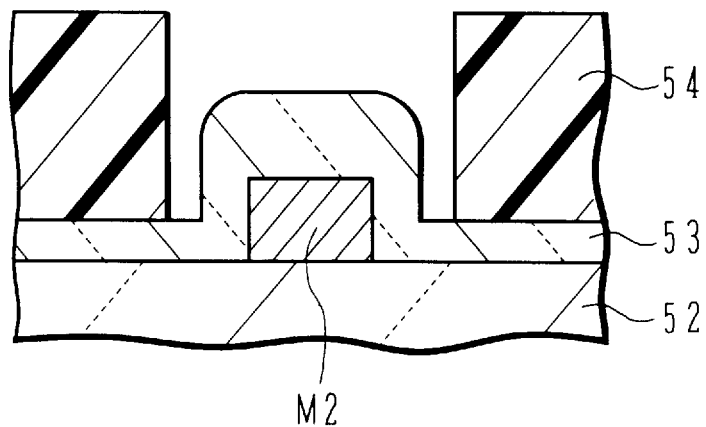
FIGS. 4A to 4J are cross sectional views explaining a conventional method of manufacturing a semiconductor device.
Figure 4B:
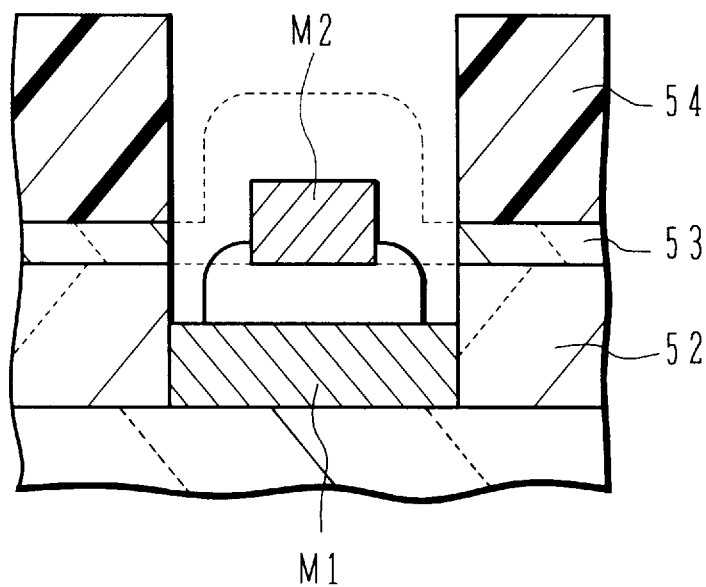
Figure 4C:
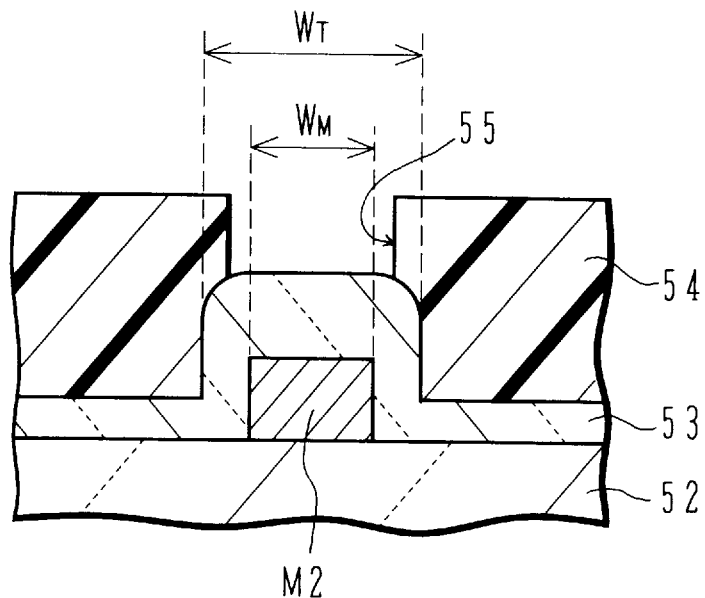
Figure 4D:
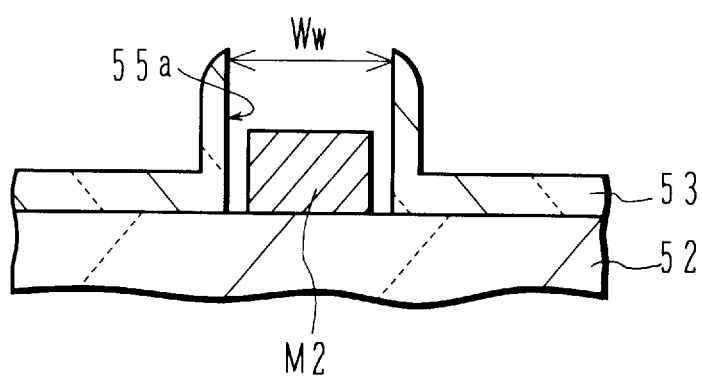
Figure 4E:
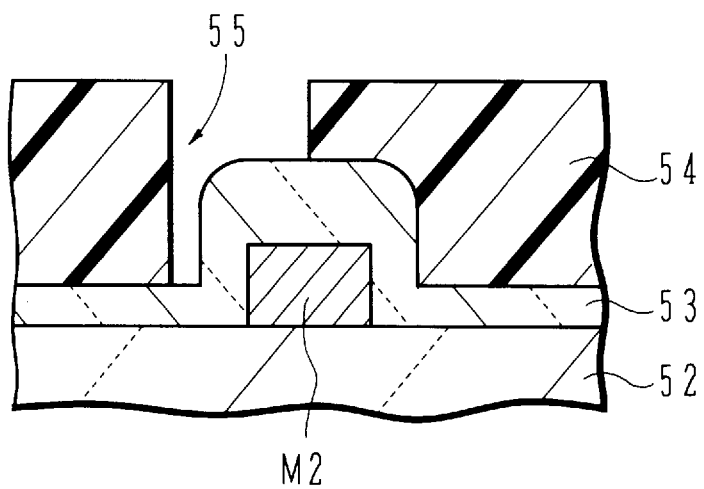
Figure 4F:
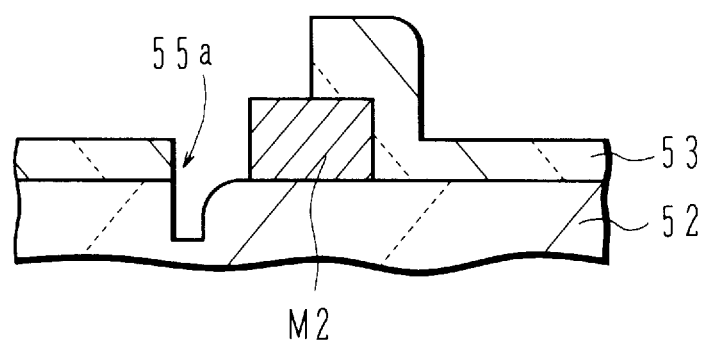
Figure 4G:
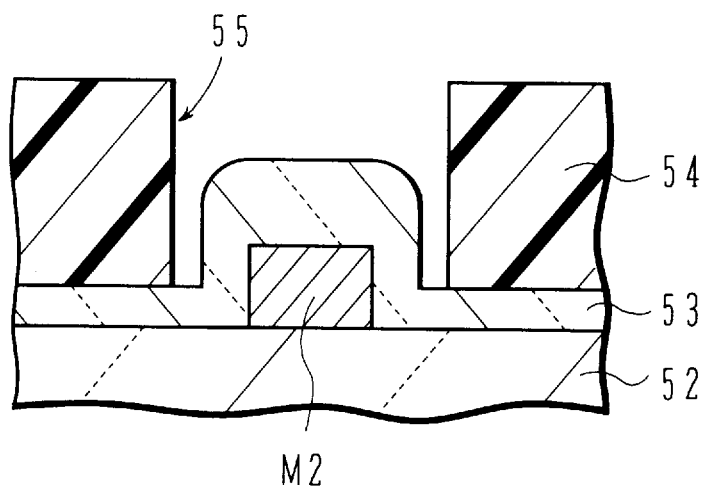
Figure 4H:
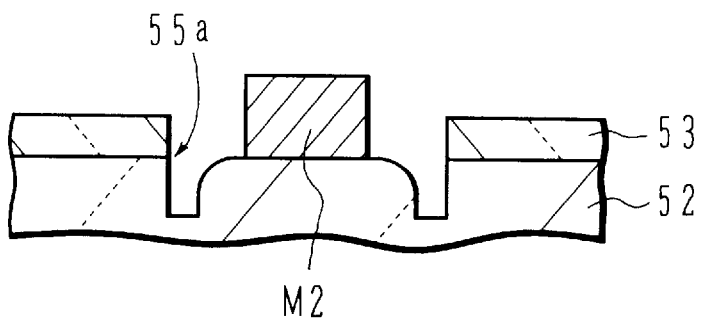
Figure 4I:
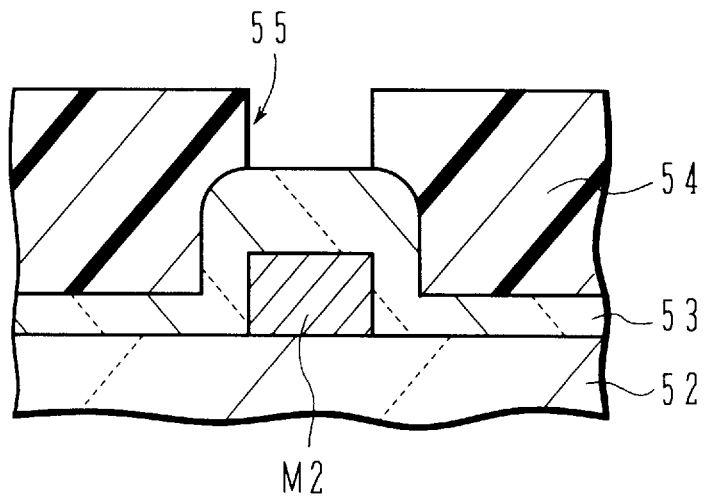
Figure 4J:
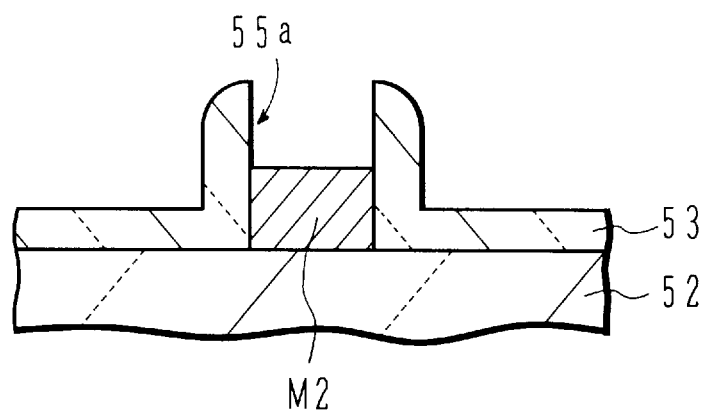

FIG. 2 is a plan view of the device shown in FIG. 1E before the metal wiring cutting. An opening is formed in the resist film 5. In this opening, windows 6a and 6b defined by the planarized film 4a are exposed. The insulating film 3 in the windows 6a and 6b has been etched and the overlying metal wiring patterns M2a and M2b are exposed. The tops and side walls of the metal wiring patterns M2a and M2b are exposed in the two windows 6a and 6b. If the etching process is performed so as to completely etch the insulating film 3 on the side walls of the overlying metal wiring patterns M2, the tops of the overlying metal wiring patterns M2 are over-etched. However, these patterns M2 are patterns to be cut so this over-etch poses no problem. Since the shoulders of the insulating film 3 are slightly curved, the uniform depth etching forms curved regions in the interlayer insulation film 2. However, this does not pose any substantial problem if the thickness of the remaining interlayer insulating film 2 is sufficient.

Figure 1F:
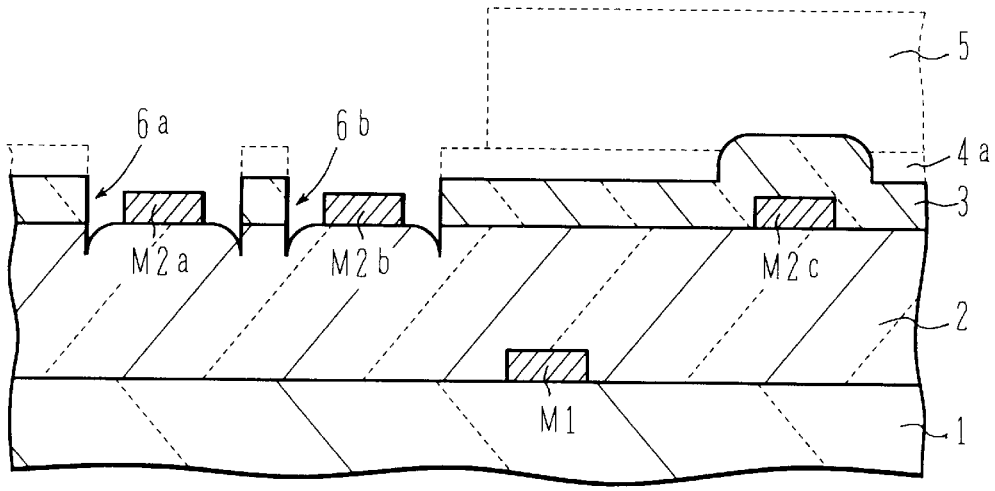

As shown in FIG. 1F, the resist pattern 5 and the planarized film 4a are removed by ashing or other processes.

Figure 1G:
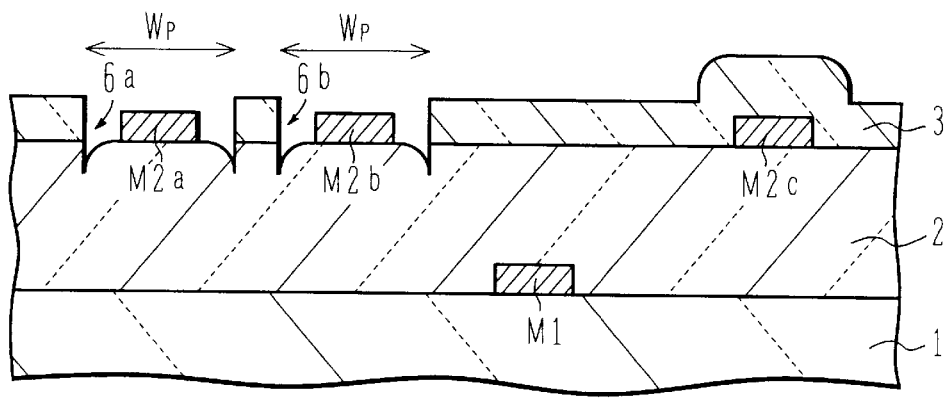

Windows W having a width $W_p$ are therefore formed as shown in FIG. 1G.

The insulating film 3 at the area other than the tops and side walls of the metal wiring patterns M2a and M2b is not etched. As a result, the lateral width of the window W is not dependent on the resist pattern 5, but is determined in a self-alignment manner by the width of the metal wiring pattern M2 and the thickness of the insulating film 3 formed on the side walls of the metal wiring pattern M2.

In the above etching process for the insulating film 3, it is preferable that the planarized film 45a made of resist or the like is sufficiently durable against the etching and has a thickness sufficient for not being completely etched. For example, the insulating film 3 is etched by 1.2 $\mu$m, and the thickness of the planarized film 4a made of resist (photo-sensitive resist material) is set to 0.4 $\mu$m or thicker. In this case, a desired etching selectivity ratio is 1.2/0.4=3 or higher. This selectivity ratio can be realized satisfactorily by the dry etching described above.

Figure 1H:
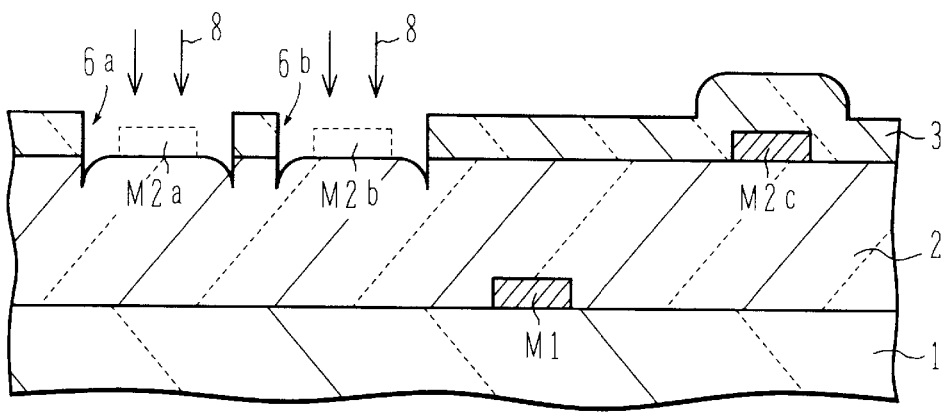

As shown in FIG. 1H, laser beams 8 such as Ar laser beams are applied to the overlying metal wiring patterns M2a and M2b exposed in the windows to cut them.

Since the tops and side walls of the overlying metal wiring patterns to be cut are exposed, the wiring patterns can be cut reliably. Since the underlying metal wiring patterns are covered with the interlayer insulating film having a sufficient thickness, they can be protected from radiation of the laser beams.

The present invention has been described in connection with the preferred embodiments. The invention is not limited only to the above embodiments. For example, the present invention can be applied to multi-level wiring layers having more than two layers. It is apparent to those skilled in the art that various changes, substitutions, modifications, improvements, combinations and the like can be made without departing from the scope of the appended claims.

I claim:

1. A method of manufacturing a semiconductor device, said method comprising the steps of:

forming an insulating film over a wiring layer pattern formed on a substrate;

forming a planarized film over the whole surface of said insulating film until the surface of said planarized film becomes flat, said planarized film being made of a material having a different property from said insulating film;

removing said planarized film until the partial surface area of said insulating film formed on the top of said metal wiring pattern is exposed;

forming a resist film on the surface of said exposed insulating film and said planarized film;

patterning said resist film to form a resist pattern having an opening exposing at least one partial exposed surface area of said insulating film;

selectively removing a partial area of said insulating film not covered with said planarized film and said resist pattern and exposing a partial area of said metal wiring pattern;

removing said resist pattern and said planarized film after said preceding steps; and cutting said exposed metal wiring pattern after said step of removing said resist pattern.

2. A method according to claim 1, wherein said cutting step includes using radiation of a laser beam.

3. A method according to claim 1, wherein said planarized film essentially consists of resist.

4. A method according to claim 1, wherein said planarized film essentially consists of polyimide.

5. A method according to claim 1, wherein said step of forming said insulating film forms an insulating film having a surface conformal with convexes and concaves of an underlying surface.

6. A method according to claim 5, wherein said step of removing said planarized film includes reactive ion etching.

7. A method of manufacturing a semiconductor device, said method comprising the steps of:

forming an insulating film over a metal wiring layer pattern formed on a substrate;

forming a planarized film over the whole surface of said insulating film until the surface of said planarized film becomes flat, said planarized film being made of a material having a different property from said insulating film;

removing said planarized film until the partial surface area of said insulating film formed on the top of said metal wiring pattern is exposed;

forming a resist film on the surface of said exposed insulating film and said planarized film;

patterning said resist film to form a resist pattern having an opening exposing at least one partial exposed surface area of said insulating film; and selectively removing a partial area of said insulating film not covered with said planarized film and said resist pattern and exposing a partial area of said metal wiring pattern, removing the exposed wiring pattern;

wherein said metal wiring pattern is an overlying metal wiring pattern formed on the surface of a flat insulating film burying an underlying metal wiring pattern.

8. A method according to claim 7, wherein said overlying metal wiring pattern is made of Al or Al alloy.

9. A method of manufacturing a semiconductor device, said method comprising the steps of:
 (a) providing a semiconductor substrate comprising:
  (a-1) a first level wiring layer;
  (a-2) second level wiring films;
  (a-3) a first interlevel insulating layer insulating the first level wiring layer and second level wiring films; and
  (a-4) a second interlevel insulating layer, which is formed over the second level wiring films so as to have convexes and concaves;
 (b) forming a first organic layer over the semiconductor substrate;
 (c) partially removing the first organic layer to expose the convexes of the second interlevel insulating layer;
 (d) selectively forming a second organic layer over the substrate except for a region where at least a part of the convexes of the second interlevel insulating layer remain exposed; and
 (e) selectively etching the exposed portion of the second interlevel insulating layer to form self-aligned windows over the second level wiring films, to expose a portion of a wiring pattern and
 (f) removing the exposed wiring pattern to achieve a desired configuration.

10. A method according to claim 9, further comprising the step of:
 (f) removing the first and second organic layers, after said step (e).

11. A method according to claim 11, wherein the first organic layer and the second organic layer comprise resist material.

12. A method according to claim 9, wherein the first organic layer and the second organic layer are made of polyimide.

13. A method according to claim 9, wherein each of the first interlevel insulating layer and the second interlevel insulating layer is made of a material selected from a group consisting of spin-on-glass (SOG), PSG and BPSG.

14. A method according to claim 9, wherein the second interlevel insulating layer is etched with a gas mixture of $CF_4$, $CHF_3$ and Ar.

15. A method according to claim 9, wherein the first organic layer and the second organic layer are removed with a gas mixture of $O_2$, $H_2$ and $N_2$.

16. A method according to claim 9, wherein the step (c) is performed by an etch-back process.

17. A method according to claim 9, wherein the step (e) is performed by a dry-etching process.

18. A method according to claim 9, wherein an etching selectivity ratio of the second interlevel insulating layer in said step (e) to the first organic layer is greater than 3.

19. A method of manufacturing a multi-layered semiconductor device, said method comprising the steps of:
 (a) providing a substrate having a multi-layered structure that at least includes a first level wiring layer, a second level wiring layer and a first interlevel insulating layer insulating therebetween;
 (b) forming a second interlevel insulating layer over the multi-layered structure, the second interlevel insulating layer having convexes and concaves which transfer topography of the multi-layered structure;
 (c) forming a first mask layer having an aperture corresponding to the convex over the semiconductor substrate;
 (d) selectively forming a second mask layer over the substrate except for a region where at least a part of the convexes of the second interlevel insulating layer remain exposed; and
 (e) selectively etching the exposed portion of the second interlevel insulating layer through the first and second mask layers to form self-aligned windows over the second level wiring layer, to expose a portion of a wiring pattern and
 (f) removing the exposed wiring pattern to achieve a desired configuration.

20. A method according to claim 19, further comprising the step of
 (f) removing the first and second mask layers, after said step (e).

21. A method according to claim 19, wherein the first mask layer and the second mask layer comprise resist material.

22. A method according to claim 19, wherein each of the first mask layer and the second mask layer is made of polyimide.

23. A method according to claim 19, wherein each of the first interlevel insulating layer and the second interlevel insulating layer are made of a material selected from a group consisting of spin-on-glass (SOG), PSG and BPSG.

24. A method according to claim 19, wherein the second interlevel insulating layer is etched with a gas mixture of $CF_4$, $CHF_3$ and Ar.

25. A method according to claim 19, wherein the first mask layer and the second mask layer are formed by etching with a gas mixture of $O_2$, $H_2$ and $N_2$.

26. A method according to claim 19, wherein the step (c) is performed by an etch-back process.

27. A method according to claim 19, wherein the step (e) is performed by a dry-etching process.

28. A method according to claim 19, wherein an etching selectivity ratio of the second interlevel layer in said step (e) to the first mask layer is greater than 3.

* * * * *